United States Patent
Shim et al.

(10) Patent No.: US 9,689,069 B2
(45) Date of Patent: Jun. 27, 2017

(54) COATING SYSTEM INCLUDING DIFFUSION BARRIER LAYER INCLUDING IRIDIUM AND OXIDE LAYER

(71) Applicant: Rolls-Royce Corporation, Indianapolis, IN (US)

(72) Inventors: Sungbo Shim, Irvine, CA (US); Ann Bolcavage, Indianapolis, IN (US); Randolph C. Helmink, Avon, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 0 days.

(21) Appl. No.: 14/642,127

(22) Filed: Mar. 9, 2015

(65) Prior Publication Data

US 2015/0259787 A1    Sep. 17, 2015

Related U.S. Application Data

(60) Provisional application No. 61/951,822, filed on Mar. 12, 2014.

(51) Int. Cl.
*B21D 39/00* (2006.01)
*C23C 14/34* (2006.01)
(Continued)

(52) U.S. Cl.
CPC .............. *C23C 14/34* (2013.01); *C23C 14/16* (2013.01); *C23C 16/0281* (2013.01); *C23C 16/06* (2013.01); *C23C 16/24* (2013.01); *C23C 16/40* (2013.01); *C23C 16/402* (2013.01); *C23C 16/50* (2013.01); *C23C 28/321* (2013.01); *C23C 28/345* (2013.01); *C23C 28/3455* (2013.01); *C25D 5/48* (2013.01); *F01D 5/3092* (2013.01); *F05D 2230/31* (2013.01); *F05D 2300/1434* (2013.01); *F05D 2300/21* (2013.01); *Y02T 50/671* (2013.01); *Y10T 428/12549* (2015.01);
(Continued)

(58) Field of Classification Search
None
See application file for complete search history.

(56) References Cited

U.S. PATENT DOCUMENTS

| | | |
|---|---|---|
| 3,770,487 A | 11/1973 | Gibson et al. |
| 4,477,538 A | 10/1984 | Clarke |

(Continued)

FOREIGN PATENT DOCUMENTS

| | | |
|---|---|---|
| EP | 1347079 A2 | 9/2003 |
| EP | 1666629 A2 | 6/2006 |

(Continued)

OTHER PUBLICATIONS

Response to Search Report dated Jul. 31, 2015, from counterpart European Application No. 15158125.3, filed Mar. 1, 2016, 38 pp.

(Continued)

*Primary Examiner* — Daniel J Schleis
(74) *Attorney, Agent, or Firm* — Shumaker & Sieffert, P.A.

(57) ABSTRACT

In some examples, an article may include a superalloy substrate and a coating on the superalloy substrate. In accordance with this example, the coating includes a diffusion barrier layer on the substrate and a wear resistant oxide layer over the diffusion barrier layer. The diffusion barrier layer may include iridium and the wear resistant oxide layer may include at least one of silica, zirconia, or chromia.

17 Claims, 7 Drawing Sheets

(51) Int. Cl.
*C23C 28/00* (2006.01)
*F01D 5/30* (2006.01)
*C23C 16/06* (2006.01)
*C23C 16/24* (2006.01)
*C23C 16/40* (2006.01)
*C23C 16/50* (2006.01)
*C25D 5/48* (2006.01)
*C23C 14/16* (2006.01)
*C23C 16/02* (2006.01)

(52) U.S. Cl.
CPC *Y10T 428/12597* (2015.01); *Y10T 428/12611* (2015.01)

(56) References Cited

U.S. PATENT DOCUMENTS

| | | |
|---|---|---|
| 4,574,015 A | 3/1986 | Genereux et al. |
| 5,059,095 A | 10/1991 | Kushner et al. |
| 5,154,885 A | 10/1992 | Czech et al. |
| RE34,173 E | 2/1993 | Kerber |
| 5,499,905 A | 3/1996 | Schmitz et al. |
| 6,207,297 B1 | 3/2001 | Sabol et al. |
| 6,306,524 B1 | 10/2001 | Spitsberg et al. |
| 6,333,118 B1 | 12/2001 | Alperine et al. |
| 6,391,479 B1 | 5/2002 | Wood |
| 6,455,173 B1 | 9/2002 | Marijnissen et al. |
| 6,532,657 B1 | 3/2003 | Weimer et al. |
| 6,558,813 B2 | 5/2003 | Darolia |
| 6,616,410 B2 | 9/2003 | Grylls et al. |
| 6,620,525 B1 | 9/2003 | Rigney et al. |
| 6,630,250 B1 | 10/2003 | Darolia |
| 6,635,362 B2 | 10/2003 | Zheng |
| 6,720,088 B2 | 4/2004 | Zhao et al. |
| 6,733,908 B1 | 5/2004 | Lee et al. |
| 6,746,728 B1 | 6/2004 | Kusumoto et al. |
| 6,861,157 B2 | 3/2005 | Zhao et al. |
| 6,899,926 B2 | 5/2005 | Narita et al. |
| 6,921,251 B2 | 7/2005 | Ackerman et al. |
| 6,926,928 B2 | 8/2005 | Ackerman et al. |
| 6,933,052 B2 | 8/2005 | Gorman et al. |
| 6,974,636 B2 | 12/2005 | Darolia et al. |
| 6,982,126 B2 | 1/2006 | Darolia et al. |
| 7,205,053 B2 | 4/2007 | Narita et al. |
| 7,258,934 B2 * | 8/2007 | Wigren ............. C23C 4/02 427/248.1 |
| 7,288,328 B2 | 10/2007 | Darolia et al. |
| 7,374,821 B2 | 5/2008 | Leclercq et al. |
| 7,378,159 B2 | 5/2008 | Gorman et al. |
| 7,396,592 B2 | 7/2008 | Saint-Ramond et al. |
| 7,416,790 B2 | 8/2008 | Jiang et al. |
| 7,544,424 B2 * | 6/2009 | Gorman ............. C23C 10/02 416/241 R |
| 7,666,515 B2 | 2/2010 | Nagaraj et al. |
| 7,695,830 B2 | 4/2010 | Strangman et al. |
| 7,709,058 B2 | 5/2010 | Kunz et al. |
| 7,749,570 B2 | 7/2010 | Rucker et al. |
| 7,766,617 B1 | 8/2010 | Liang |
| 8,047,775 B2 | 11/2011 | Barnikel et al. |
| 8,187,717 B1 | 5/2012 | Xie et al. |
| 8,696,304 B2 * | 4/2014 | Elliott ............. F01D 5/081 415/115 |
| 8,921,251 B2 | 12/2014 | Zilbershtein et al. |
| 2003/0186075 A1 | 10/2003 | Zhao et al. |
| 2003/0208904 A1 | 11/2003 | Tefft |
| 2006/0040129 A1 | 2/2006 | Darolia et al. |
| 2006/0121304 A1 * | 6/2006 | Gorman ............. C23C 28/021 428/621 |
| 2008/0069959 A1 | 3/2008 | Leclercq et al. |
| 2008/0138647 A1 | 6/2008 | Jiang et al. |
| 2008/0193657 A1 | 8/2008 | Raybould et al. |
| 2009/0061086 A1 | 3/2009 | Jiang et al. |
| 2009/0269207 A1 | 10/2009 | Eichmann et al. |
| 2009/0317658 A1 | 12/2009 | Narita |
| 2010/0178169 A1 | 7/2010 | Webb |
| 2010/0239429 A1 | 9/2010 | Eichmann et al. |
| 2010/0252151 A1 | 10/2010 | Furrer et al. |
| 2011/0299996 A1 | 12/2011 | Uihlein et al. |
| 2014/0134455 A1 | 5/2014 | Bolcavage et al. |

FOREIGN PATENT DOCUMENTS

| | | |
|---|---|---|
| EP | 1806433 A2 | 7/2007 |
| GB | 2444611 A | 6/2008 |
| JP | H03120327 A | 5/1991 |
| JP | 2001323332 A | 11/2001 |
| JP | 2002302779 A | 10/2002 |
| JP | 2003277860 A | 10/2003 |
| JP | 2003277953 A | 10/2003 |
| JP | 2004518820 A | 6/2004 |
| JP | 2006057182 A | 3/2006 |
| JP | 2006161808 A | 6/2006 |
| JP | 2008144275 A | 6/2008 |
| RU | 2405064 C2 | 3/2009 |
| RU | 2365565 C2 | 8/2009 |
| RU | 2370471 C2 | 10/2009 |
| UA | 35621 C2 | 4/2001 |
| UA | 46761 C2 | 6/2002 |
| UA | 48169 C2 | 9/2002 |
| WO | 9631636 A1 | 10/1996 |
| WO | 9634130 A1 | 10/1996 |
| WO | 2012142422 A1 | 10/2012 |

OTHER PUBLICATIONS

Examination Report from counterpart European Application No. 15158125.3, dated Apr. 29, 2016, 5 pp.
Polyak M.S., "Technology of Hardening," (Tekhnologiya uprochneniya) Moscow, Mashinostroenie, L.V.M. Script, vol. 1, 1995, 7 pp. (Applicant points out that, in accordance with MPEP 609.04(a), the 1995 year of publication is sufficiently earlier than the effective U.S. filing date and any foreign priority date of Mar. 12, 2014 so that the particular month of publication is not in issue.).
Extended European Search Report from counterpart European Application No. 15158125.3, dated Jul. 31, 2015, 8 pp.
Fisher et al., "An assessment of the oxidation resistance of an iridium and an iridium/platinum low activity alunninide/ MarM002 system at 1100 C," Surface and Coatings Technology, vol. 113, No. 3, Mar. 31, 1999, pp. 259-267.
Response to Examination Report dated Apr. 29, 2016, from counterpart European Application No. 15158125.3, filed Jul. 29, 2016, 12 pp.

* cited by examiner

COATING SYSTEM INCLUDING DIFFUSION BARRIER LAYER INCLUDING IRIDIUM AND OXIDE LAYER

This application claims the benefit of U.S. Provisional Application No. 61/951,822, filed Mar. 12, 2014, and titled, "COATING SYSTEM INCLUDING DIFFUSION BARRIER LAYER INCLUDING IRIDIUM AND OXIDE LAYER," the entire content of which is incorporated herein by reference.

TECHNICAL FIELD

The disclosure relates to coatings for superalloy substrates.

BACKGROUND

Gas turbine engines include compressor blades that rotate to compress inlet gases and turbine blades that rotate to harness energy from expansion of outlet gases. Gas turbine blades are attached to gas turbine disks. The gas turbine disks rotate with the gas turbine blades and may experience peak stresses in excess of about 1000 megapascals (MPa) due to centrifugal loading from the gas turbine blades and weight of the gas turbine disks themselves.

In some examples, gas turbine disks may not be directly exposed to the flow path of hot gases in the gas turbine engine. Thus, in some implementations, maximum surface temperatures of the gas turbine disks may be about 650° C. The thermal and mechanical stresses to which the gas turbine disks are exposed impose design criteria which the alloys that form the gas turbine disks may satisfy. These design criteria include relatively high yield strength and tensile strength to inhibit yield and fracture of the gas turbine disk, relatively high ductility and fracture toughness to impart tolerance to defects, relatively high resistance to initiation of fatigue cracks, and relatively low fatigue crack propagation rates. In some implementations, gas turbine disks may be formed from nickel (Ni)-based superalloys, which may satisfy at least some of these design criteria.

SUMMARY

The disclosure describes an article that includes a substrate, a diffusion barrier layer on the substrate, and a wear resistant oxide layer on the diffusion barrier layer, and techniques for forming such an article. The diffusion barrier layer may reduce diffusion of elements between the wear resistant oxide layer and the substrate and/or between the substrate and the wear resistant oxide layer. In some examples, this may help maintain the chemical composition, phase constitution and/or microstructure of the wear resistant oxide layer and/or the substrate, which may help maintain the properties of the wear resistant oxide layer and/or the substrate.

The wear resistant oxide layer may include at least one of silica, chromia, or zirconia. The diffusion barrier layer and the wear resistant oxide layer may be applied to a substrate at locations where the substrate is likely to come into contact with another substrate. For example, the diffusion barrier layer and the wear resistant oxide layer may be applied to a gas turbine disk at locations of a fir tree connection where the disk a gas turbine engine blade to couple the blade and disk. Locations such as these may be subject to rubbing during operation of the gas turbine engine. The oxide coating may provide a layer that is resistant to mechanical wear due to the rubbing between the substrates. Additionally, the oxide coating may have relatively low surface roughness compared to a bare metal surface or a surface coated with a metallic coating. This low surface roughness may reduce fretting of the gas turbine engine surfaces that contact the coating, e.g., compared to examples where the gas turbine engine surfaces contact bare metal.

The diffusion barrier layer may include iridium (Ir) or an alloy including iridium. The diffusion barrier layer may reduce or substantially prevent diffusion between the substrate and the wear resistant oxide layer and/or between the wear resistant oxide layer and the substrate. This may result in properties of the wear resistant oxide layer and the substrate being more consistent over time than if diffusion between the wear resistant oxide layer and substrate occurs.

In some examples, the coating system may additionally include a metallic protective layer between the diffusion barrier layer and the oxide coating. The metallic protective layer may include an element or elements that provide to the substrate environmental protection against hot gases and chemical species in the gas turbine environment. For example, the metallic protective layer may provide protection from oxidation and/or hot-corrosion of the substrate. The metallic protective layer may include aluminum, chromium, an alloy including aluminum, an alloy including chromium, or a NiFeCrMnSi alloy.

In some examples, the disclosure describes an article including a superalloy substrate and a coating on the superalloy substrate. In accordance with this example, the coating includes a diffusion barrier layer on the substrate and a wear resistant oxide layer over the diffusion barrier layer. The diffusion barrier layer may include iridium and the wear resistant oxide layer may include at least one of silica, zirconia, or chromia.

In some examples, the disclosure describes a method including depositing a diffusion barrier layer on a superalloy substrate and depositing a wear resistant oxide layer over the diffusion barrier layer. In accordance with this example, the diffusion barrier layer may include Ir and the wear resistant oxide layer comprises at least one of silica, zirconia, or chromia.

The details of one or more examples are set forth in the accompanying drawings and the description below. Other features, objects, and advantages will be apparent from the description and drawings, and from the claims.

DETAILED DESCRIPTION

As described above, a gas turbine disk may include a substrate and a wear resistant oxide layer on a surface of the substrate, which may provide wear resistance to the surface of the substrate. However, in some examples, interdiffusion of elements or compounds between the substrate and the wear resistant oxide layer or between the wear resistant oxide layer and the substrate may deleteriously affect properties of the substrate and/or the wear resistant oxide layer. For example, the substrate may include a Ni-based superalloy that includes additional elements such as titanium (Ti), cobalt (Co), or aluminum (Al), which beneficially affect the properties of the substrate. However, diffusion of Ti or Co from the substrate into the wear resistant oxide layer may adversely affect the coefficient of friction of the wear resistant oxide layer. As another example, diffusion of Al from the substrate to the wear resistant oxide layer may lower Al content in at least a portion of the substrate, which may result in a reduced gamma prime ($\gamma'$) phase volume fraction in the portion of the substrate. A reduced $\gamma'$ phase volume fraction may adversely impact mechanical properties of the substrate.

Additionally, in some examples, diffusion of elements from the substrate to the wear resistant oxide layer or from the wear resistant oxide layer to the substrate may result in formation of additional phases or layers during prolonged exposure to high temperatures, such as thousands of hours around 700° C., hundreds of hours around 750° C., or tens of hours around 800° C. For example, a brittle and/or non-strain compliant phase may form in the protective layer during exposure to high temperatures, which may adversely impact performance of the protective layer. One example of a brittle and/or non-strain compliant phase includes a topologically close-packed phase that may form from chromium and a refractory element, such as molybdenum (Mo) or tungsten (W).

In accordance with aspects of the present disclosure, an article may include a diffusion barrier layer between the substrate and the wear resistant oxide layer. The diffusion barrier layer may reduce or substantially prevent diffusion between the substrate and the wear resistant oxide layer and/or between the wear resistant oxide layer and the substrate. In some examples, this may reduce or substantially eliminate one or more of the deleterious effects due to diffusion that were discussed above. The diffusion barrier layer includes Ir or an Ir alloy.

Figure 1:
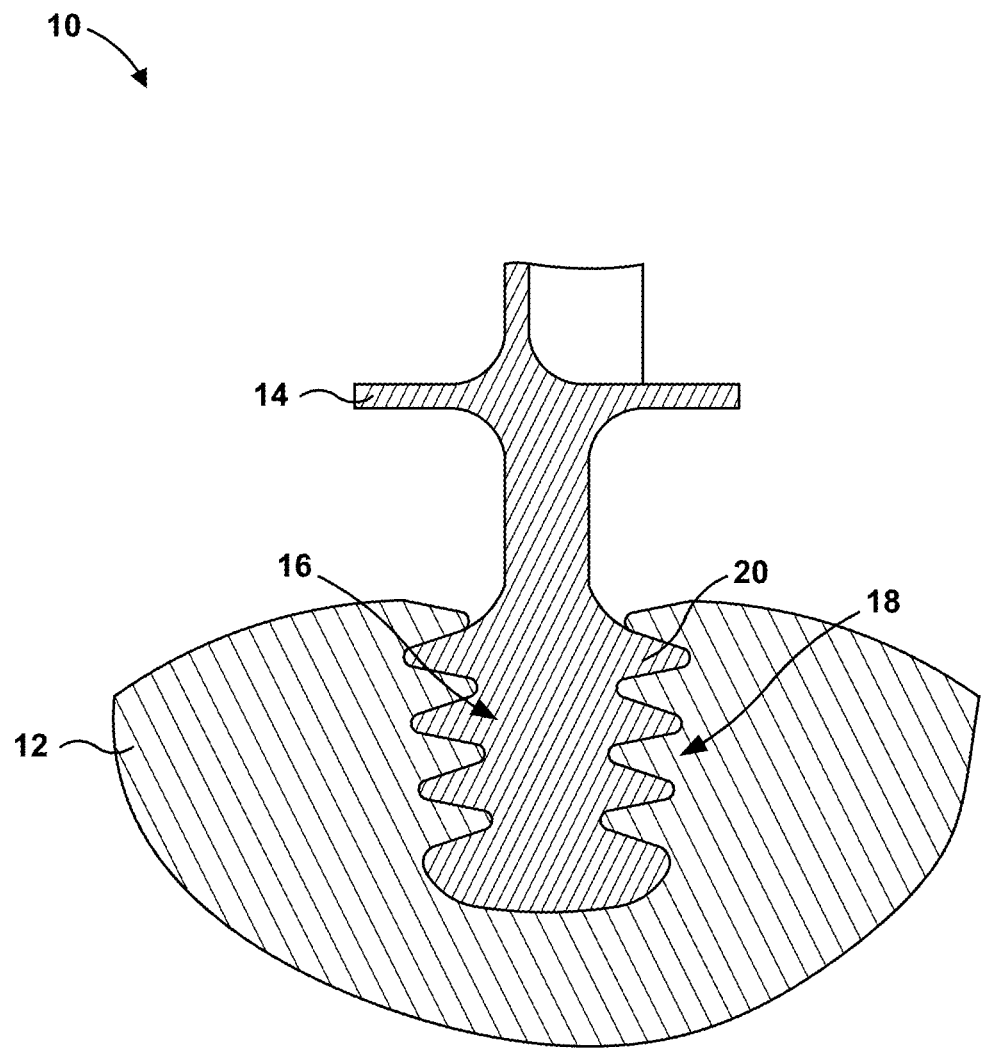
FIG. 1 is a conceptual diagram illustrating a cross-sectional view of an example article that includes a gas turbine engine disk and a gas turbine engine blade.

FIG. 1 is a conceptual diagram illustrating a cross-sectional view of an example article 10 that includes a gas turbine engine disk 12 and a gas turbine engine blade 14. In gas turbine engines, turbine blades 14 may be connected to turbine disks 12 using fir tree connections. In such connections, each gas turbine engine blade 14 has a dovetail or blade root 16 that is inserted into a fir tree recess 18 formed in gas turbine engine disk 12. The facing sides of blade root 16 and fir tree recess 18 have respective serrations 20, which may take the form of projections and grooves extending in the direction of insertion of blade root 16 into fir tree recess 18. In this way, the fir tree connection may prevent gas turbine engine blade 14 from flying outwardly from gas turbine engine disk 12 during operation of the gas turbine engine and rotation of gas turbine engine blade 14 and disk 12.

Surfaces of blade root 16 and fir tree recess 18 form contact points between gas turbine engine disk 12 and gas turbine engine blade 14. During operation of the gas turbine engine, gas turbine engine disk 12 and gas turbine engine blade 14 may rub against each other at these contact points due to relative motion between gas turbine engine disk 12 and gas turbine engine blade 14. In some examples, the rubbing between gas turbine engine disk 12 and gas turbine engine blade 14 at these contact points may result in fretting.

In accordance with some examples of this disclosure, a diffusion barrier layer and a wear resistant oxide layer may be applied to a gas turbine engine disk 12 at the points of contact between gas turbine engine disk 12 and gas turbine engine blade 14. For example, the coating including the diffusion barrier layer and the wear resistant oxide layer may be applied to the surface of fir tree recess 18. The oxide coating may provide a layer that is resistant to mechanical wear due to the rubbing between the substrates. Additionally, the oxide coating may have relatively low surface roughness compared to a bare metal surface or a surface coated with a metallic coating. This lower surface roughness may reduce fretting of portions of gas turbine engine blade 14 that contact gas turbine engine disk 12.

The diffusion barrier layer may reduce or substantially prevent diffusion between the substrate and the wear resistant oxide layer and/or between the wear resistant oxide layer and the substrate. In some examples, this may reduce or substantially eliminate one or more of the deleterious effects due to diffusion that were discussed above.

In some examples, a coating on the surfaces of fir tree recess 18 may additionally include a metallic protective layer between the diffusion barrier layer and the oxide coating. The metallic protective layer may include provide to the portions of gas turbine engine disk 12 coated with the metallic protective layer environmental protection against hot gases and chemical species in the gas turbine environment. In some examples, the metallic protective layer includes at least one of aluminum or chromium. In examples in which the coating includes the metallic protective layer, the diffusion barrier layer may reduce or substantially prevent diffusion between the substrate of gas turbine engine disk 12 and the metallic protective layer and vice versa, which may maintain desired properties of both the substrate and the metallic protective layer.

Figure 2:
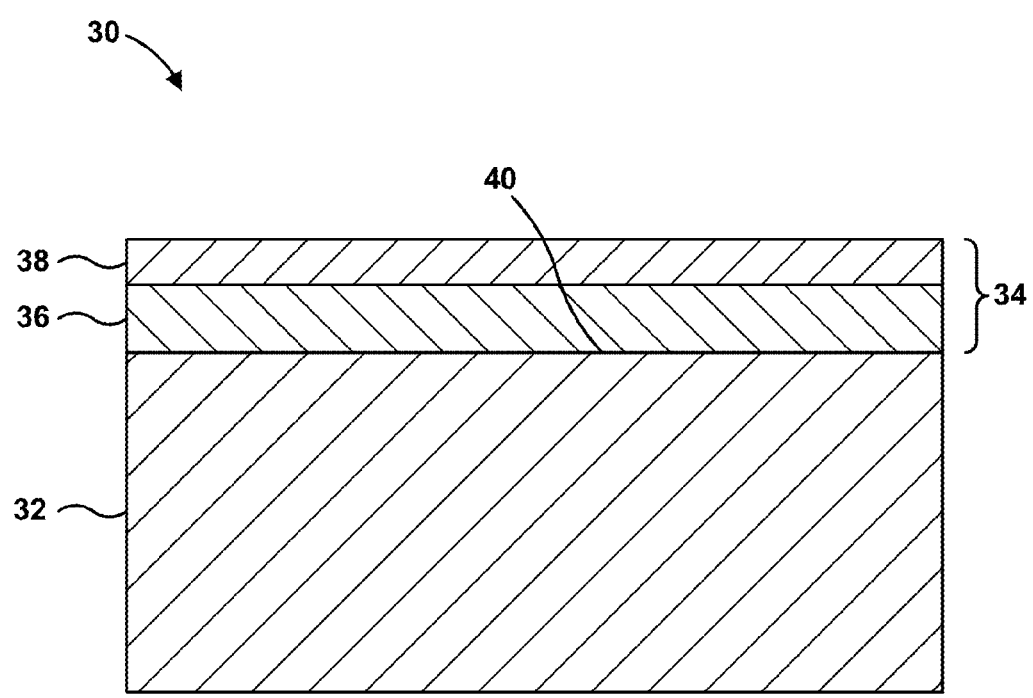
FIG. 2 is a conceptual diagram illustrating a cross-sectional view of an example article that includes a substrate, a diffusion barrier layer, and a wear resistant oxide layer.

FIG. 2 is a conceptual diagram illustrating a cross-sectional view of an example article 30 that includes a substrate 32 coated with a coating 34. In the example illustrated in FIG. 2, coating 34 includes a diffusion barrier layer 36 on substrate 32 and a wear resistant oxide layer 38 on diffusion barrier layer 36. In some examples, article 30 may include a gas turbine engine disk 10, as illustrated in FIG. 1.

Substrate 32 may include a superalloy, such as a Ni-based or Co-based superalloy. In some examples, substrate 32 includes a Ni-based superalloy suitable for use in a gas turbine engine disk or gas turbine engine spacer. As described above, the superalloy from which a gas turbine engine disk is formed may satisfy certain design criteria, including, for example, relatively high yield strength and tensile strength to inhibit yield and fracture of the gas turbine engine disk, relatively high ductility and fracture toughness to impart tolerance to defects, relatively high resistance to initiation of fatigue cracks, and relatively low fatigue crack propagation rates.

Properties of the superalloy from which substrate 12 is formed may be a function of the composition of the superalloy and the phase constitution and microstructure of the superalloy. The microstructure of the superalloy may include the grain size of the superalloy and a precipitate phase composition, size, and volume fraction. In some examples, the phase constitution and microstructure of the superalloy may be affected by mechanical and thermal processing of the superalloy. For example, thermal processing, e.g., heat treatment, of the superalloy may affect grain structure of the superalloy, precipitate phase size and/or composition, or the like.

In some examples, substrate 32 includes a polycrystalline Ni-based superalloy, which includes a plurality of grains. Substrate may include at least one of Al, Ti, or Ta in addition to Ni. In some examples, a concentration of elements, such as between about 2 weight percent (wt. %) and about 5 wt. % Al, between about 2 wt. % and about 5 wt. % Ti, and less than about 3 wt. % tantalum (Ta), in substrate 32 may be sufficient to result in gamma-prime ($\gamma'$) precipitate formation in substrate 32. For example, the concentration of Al, Ti, and/or Ta in substrate 32 may result in a $\gamma'$ precipitate phase volume fraction between about 40 volume percent (vol. %) and about 55 vol. %. In some instances, higher or lower elemental contents of the individual gamma prime forming elements can be employed while maintaining the overall gamma prime phase fraction at desired levels for properties such as strength and ductility. The volume fraction, size, and distribution of the $\gamma'$ precipitate phase may be influenced by the alloy composition, heat treatment temperature, heat treatment duration, and cooling rate during heat treatment. Additionally, substrate 32 may include grain sizes between about 5 micrometers ($\mu m$) in diameter to between about 30 $\mu m$ and about 50 $\mu m$ or more in diameter, engineered for a combination of yield strength, resistance to fatigue crack initiation, creep strength, and resistance to fatigue crack growth. In some examples, substrate 32 may include additional elements that segregate to grain boundaries of substrate 32. The segregating elements may affect creep resistance and low-cycle fatigue resistance of substrate 32. Examples of segregating elements include boron (B; up to about 0.03 weight percent (wt. %) of substrate 12), carbon (C; up to about 0.05 wt. % of substrate 32), and zirconium (Zr; up to about 0.1 wt. % of substrate 32). Examples of compositions and heat treatment techniques that may result in suitable Ni-based disk alloys are described in U.S. patent application Ser. No. 12/755,170, entitled "TECHNIQUES FOR CONTROLLING PRECIPITATE PHASE DOMAIN SIZE IN AN ALLOY," and filed Apr. 6, 2010, the entire content of which is incorporated herein by reference.

In an example, substrate 32 may include a Ni-based superalloy with a composition of about 15 wt. % Cr, about 18.5 wt. % Co, about 5 wt. % Mo, about 3 wt. % Al, about 3.6 wt. % Ti, about 2 wt. % Ta, about 0.5 wt. % Hf, about 0.06 wt. % Zr, about 0.027 wt. % C, about 0.015 wt. % B, and a balance Ni (about 52.3 wt. % Ni).

Coating 34 is on surface 40 of substrate 32 and includes diffusion barrier layer 36 and wear resistant oxide layer 38. Diffusion barrier layer 36 includes a composition that reduces diffusion between substrate 32 and wear resistant oxide layer 38 and/or between wear resistant oxide layer 38 and substrate 32. For example, when diffusion barrier layer 36 is initially deposited on substrate 32, diffusion barrier layer 36 may include Ir or an Ir alloy (and may include elements other than those listed described as being present in diffusion barrier layer 36). In some examples, when diffusion barrier layer 36 is initially deposited on substrate 32, diffusion barrier layer 36 may consist essentially of Ir; that is, diffusion barrier layer 36 may include Ir and elements that do not materially affect the basic and novel characteristics of diffusion barrier layer 36 when diffusion barrier layer 36 initially is formed on substrate 32. In other examples, when diffusion barrier layer 36 is initially deposited on substrate 32, diffusion barrier layer 36 may consist essentially of an Ir alloy; that is, diffusion barrier layer 36 may include the elements specified in the Ir alloy and elements that do not materially affect the basic and novel characteristics of diffusion barrier layer 36 when diffusion barrier layer 36 initially is formed on substrate 32. In other examples, diffusion barrier layer 36 may consist of Ir or an Ir alloy when initially formed on substrate 32.

In some examples, diffusion barrier layer 36 may include various alloys of Ir and other elements. For example, diffusion barrier layer 36 may include an alloy of Ir and Cr. As another example, diffusion barrier layer 36 may include an alloy of Ir and Si. As another example, diffusion barrier layer 36 may include an alloy of Ir and at least one additional platinum group metal, such as Pt, Pd, Re, Ru, or Rh. In some examples, diffusion barrier layer 36 may include an alloy of Ir, Cr, and Si or an alloy of Ir, Cr, Si, and at least one of Pt, Pd, Re, Ru, or Rh. As described above, when initially formed on substrate 32, diffusion barrier layer 36 may include, consist essentially of, or consist of any of the alloys described herein. In general, the composition of diffusion barrier layer 36 may be selected to be chemically stable at the interface between substrate 32 and diffusion barrier layer 36 (e.g., surface 40).

In some examples in which diffusion barrier layer 36 includes an Ir alloy, the Ir alloy may include a predominance of Ir. In other words, the Ir alloy may include more Ir than any other single element in the alloy, determined on a weight basis. In other examples, the Ir alloy may not include a predominance Ir, e.g., the alloy may include another element in an amount greater than the amount of Ir.

In some examples, the Ir alloy may include a majority Ir. A majority Ir means greater than 50 wt. % Ir. In other examples, the Ir alloy may not include a majority Ir, e.g., the alloy may include other elements in a total amount greater than the amount of Ir.

An example of an Ir composition that may be utilized in diffusion barrier layer 36 includes between about 10 wt. % and about 40 wt. % Ir, between about 26.2 wt. % and about 65 wt. % Ni, between about 15 wt. % and about 30 wt. % Fe, between about 10 wt. % and about 30 wt. % Cr, less than about 1 wt. % Mn, less than about 2 wt. % Al, and less than about 0.8 wt. % Si.

Figure 3:
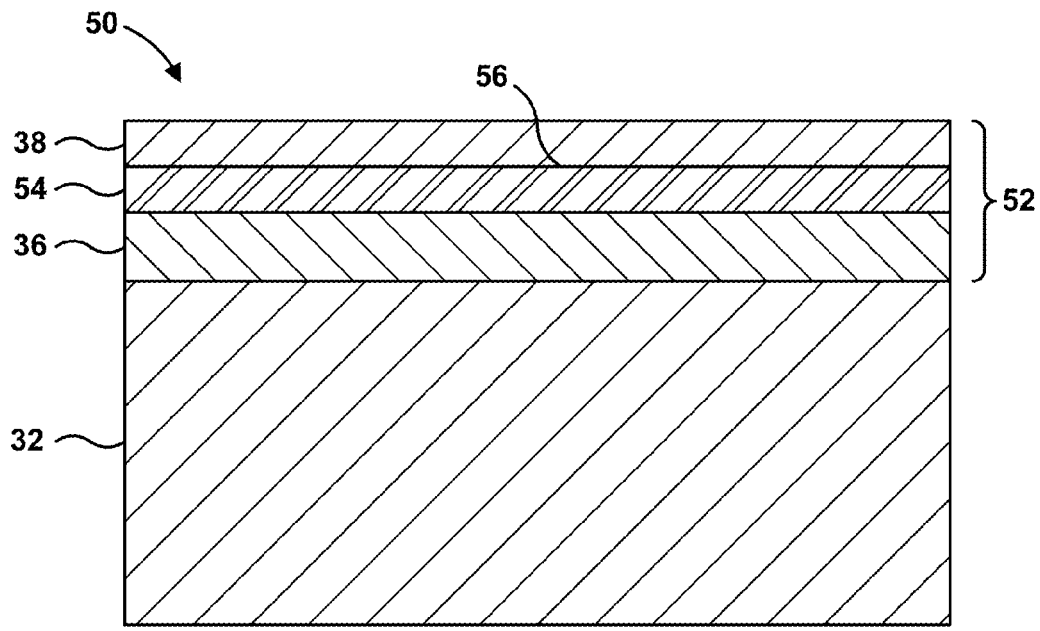
FIG. 3 is a conceptual diagram illustrating a cross-sectional view of an example article that includes a substrate and a coating that includes a diffusion barrier layer, a metallic protective coating, and a wear resistant oxide layer.

In some examples, diffusion barrier layer 36 may be essentially free of elements that are deleterious to oxidation- or hot corrosion-resistance of a metallic protective layer that may be deposited on diffusion barrier layer 36 (FIG. 3). For example, diffusion barrier layer 36 may be essentially free of Ti and Co, which may be deleterious to oxidation- or hot corrosion-resistance of the metallic protective layer.

Diffusion barrier layer 36 may be formed on substrate 32 using, for example, directed vapor deposition (DVD), electroplating, ion-assisted electron-beam deposition, or nanoscale electroplating. Some of these techniques, such as DVD, allow depositing diffusion barrier layer 36 at locations that are not line-of-site with the coating source. This may facilitate deposition of diffusion barrier layer 36 on surfaces with complex geometry, such as fir tree recess 18 (FIG. 1). Any of these techniques may facilitate deposition of single or multiple layers of material with a controlled composition and thickness. In some examples, diffusion barrier layer 36 may be deposited at temperatures below a temperature that could result in microstructure changes in substrate 32. This may allow diffusion barrier layer 36 to be formed on substrate 32 substantially without affecting the physical properties of substrate 32. In some examples, diffusion barrier layer 36 and wear resistant oxide layer 38 may be deposited using the same technique, while in other examples, diffusion barrier layer 36 and wear resistant wear resistant oxide layer 38 may be deposited using different techniques.

Coating 34 also includes wear resistant oxide layer 38 disposed on diffusion barrier layer 36. Wear resistant oxide layer 38 may include an oxide of at least one of silicon (Si), chromium (Cr), or zirconium (Zr). In some examples, wear resistant oxide layer 38 includes, consists essentially of, or consists of silica. In other examples, wear resistant oxide layer 38 includes, consists essentially of, or consists of silica and an oxide of chromium. In other examples, wear resistant oxide layer 38 includes, consists essentially of, or consists of silica and an oxide of zirconium. In other examples, wear resistant oxide layer 38 includes, consists essentially of, or consists of silica, an oxide of chromium, and an oxide of zirconium. The wear resistant oxide layer may be thermally stable up to temperatures of about 800° C. to 900° C.

Wear resistant oxide layer 38 may be deposited on diffusion barrier layer rather than thermally grown on diffusion barrier layer 36. By depositing wear resistant oxide layer 38 rather than thermally growing a wear resistant oxide layer, the composition, thickness, and surface properties of wear resistant oxide layer 38 may be better controlled. For example, a thermally grown wear resistant oxide layer 38 may include a mixture of oxides of constituents of diffusion barrier layer 36 in ratios that are affected by the composition of diffusion barrier layer 36 and the reactivities with oxygen of the constituents of diffusion barrier layer 36. Thermally growing a wear resistant oxide layer also may result in less control over the thickness of the wear resistant oxide layer compared to depositing wear resistant oxide layer 38.

Wear resistant oxide layer 38 may be deposited using plasma enhanced chemical vapor deposition (PE-CVD), radio frequency (RF) sputtering, sol-gel coating, or the like. Some of these techniques, such as sol-gel coating and PE-CVD, allow depositing wear resistant oxide layer 38 at locations that are not line-of-site with the coating source. This may facilitate deposition of wear resistant oxide layer 38 on surfaces with complex geometry, such as fir tree recess 18 (FIG. 1). Any of these techniques may facilitate deposition of single or multiple layers of material with a controlled composition and thickness. In some examples, wear resistant oxide layer 38 may be deposited at temperatures below a temperature that could result in microstructure changes in substrate 32. This may allow wear resistant oxide layer 38 to be formed on substrate 32 without substantially affecting the physical properties of substrate 32.

By depositing wear resistant oxide layer 38 using one of these methods, rather than thermally growing wear resistant oxide layer 38, the properties of wear resistant oxide layer 38 may be better controlled. For example, wear resistant oxide layer 38 may be resistant to mechanical wear due to the rubbing between article 30 and another component. For example, article 30 may be a gas turbine engine disk (e.g., disk 10 of FIG. 1). Coating 34 may be applied to surfaces of fir tree recess 18. Wear resistant oxide layer 38 may be resistant to mechanical wear due to rubbing between surfaces of blade root 16 and fir tree recess 18. Additionally, wear resistant oxide layer 38 may have relatively low surface roughness compared to a bare metal surface (e.g., surface 40) or a surface of diffusion barrier layer 36. This lower surface roughness may reduce fretting of portions of gas turbine engine blade 14 that contact wear resistant oxide layer 38.

Additionally, in some examples, wear resistant oxide layer 38 may provide environmental resistance to substrate 12 by providing a barrier to oxygen or corrosive chemical species from accessing substrate 12.

In some examples, coating 34 may be selectively applied to portions of gas turbine engine disk 12. For example, coating 34 may be selectively applied to surfaces of fir tree recess 18, while remaining surfaces of gas turbine engine disk 12 may be coated with coating 34, may be coated with another coating, or may be left uncoated. In this way, coating 34, including wear resistant oxide layer 38, may provide wear resistance to appropriate portions of portions of gas turbine engine disk 12, while allowing other portions of gas turbine engine disk 12 to be appropriately coated.

In some examples, wear resistant oxide layer 38 may be relatively thin, which may result in wear resistant oxide layer 38 being less prone to cracking under thermal cycling. Further, by being relatively thin, coating 34 may be utilized while maintaining the dimensions of article 30 substantially similar to the dimensions prior to application of coating 34. In some examples, coating 34 may have a thickness between about 0.0001 inches (about 2.5 μm) to about 0.001 inches (about 25.4 μm). In some examples, coating 34 may have a thickness between about 0.0002 inches (about 5 μm) to about 0.0004 inches (about 10 μm). The total thickness of coating 34 includes the thickness of both diffusion barrier layer 16 and protective layer 38. The total thickness of coating 34 may be measured substantially normal to a surface 40 of substrate 32 on which coating 34 is formed.

In some examples, wear resistant oxide layer 38 may have a thickness of between about 0.00002 inches (about 0.5 μm) and about 0.0004 inches (about 10 μm). In some examples, wear resistant oxide layer 38 may have a thickness of between about 0.00002 inches (about 0.5 μm) and about 0.00024 inches (about 6 μm).

In some examples, the diffusion barrier layer 36 may account for between about 5% and about 75% of the thickness of coating 34, such as between about 5% and about 50% of the thickness of coating 34, between about 10% and about 30% of the thickness of coating 34, or between about 25% and about 50% of the thickness of coating 34. The ranges of thickness of coating 34, diffusion barrier layer 36, and wear resistant oxide layer 38 listed herein are merely examples and other thicknesses of coating 34, diffusion barrier layer 36, and wear resistant oxide layer 38 may be utilized and fall within the scope of this disclosure.

In some examples, in addition to including a diffusion barrier layer 36 and a wear resistant oxide layer 38, a coating may include a metallic protective layer. FIG. 3 is a conceptual diagram illustrating a cross-sectional view of an example article 50 that includes a substrate 32 and a coating 52 that includes a diffusion barrier layer 36, a metallic protective coating 54, and a wear resistant oxide layer 38. Article 50 may include a gas turbine engine disk 10, as illustrated in FIG. 1.

Substrate 32, diffusion barrier layer 36, and wear resistant oxide layer 38 may be similar to or substantially the same (e.g., the same or nearly the same) as described above with respect to FIG. 2. In addition to diffusion barrier layer 36 and wear resistant oxide layer 38, coating 52 includes metallic protective coating 54 disposed between diffusion barrier layer 36 and wear resistant oxide layer 38.

Metallic protective layer 54 may include an element or elements that provide to substrate 32 environmental protection against hot gases and chemical species in the gas turbine environment. For example, metallic protective layer 56 may provide protection from oxidation and/or hot-corrosion of substrate 32. In some examples, metallic protective layer 54 includes at least one of aluminum or chromium. In an example, metallic protective layer 54 may include NiFeCrMnSi alloy with a nominal composition of about 30 wt. % Cr, 30 wt. % iron (Fe), 1 wt. % manganese (Mn), 1 wt. % silicon (Si), and a balance Ni (about 38 wt. % Ni).

Metallic protective layer 54 may be applied using, for example, cathodic arc physical vapor deposition (PVD), directed vapor physical-vapor deposition (DVD), electroplating, or nano-scale electroplating. Any of these techniques may facilitate deposition of single or multiple layers of material with a controlled composition and thickness. In some examples, metallic protective layer 54 may be deposited at temperatures below a temperature of about 800° C. that could result in microstructure changes in substrate 32. This may allow metallic protective layer 54 to be formed on diffusion barrier layer 36 substantially without affecting the physical properties of substrate 32.

In some examples, as shown in FIG. 3, wear resistant oxide layer 38 may be directly on metallic protective layer 54. In some examples, metallic protective layer 54 may be peened prior to depositing metallic protective layer 54 to smooth the surface 56 of metallic protective layer 54, improve fatigue strength of metallic protective layer 54, or both.

Figure 4:
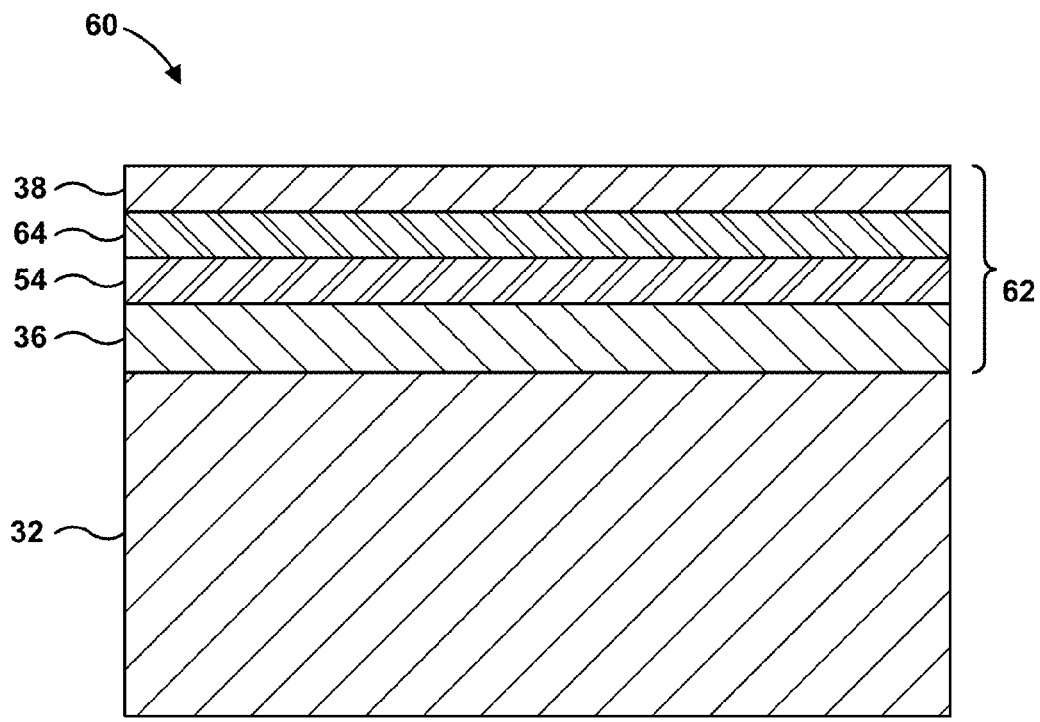
FIG. 4 is a conceptual diagram illustrating a cross-sectional view of an example article that includes a substrate and a coating that includes a diffusion barrier layer, a metallic protective coating, an environmentally-resistant oxide layer, and a wear resistant oxide layer.
Figure 5A:
FIGS. 5A-5E are a series of photographs illustrating results of the wear testing for each of a plurality of samples.
Figure 5A:
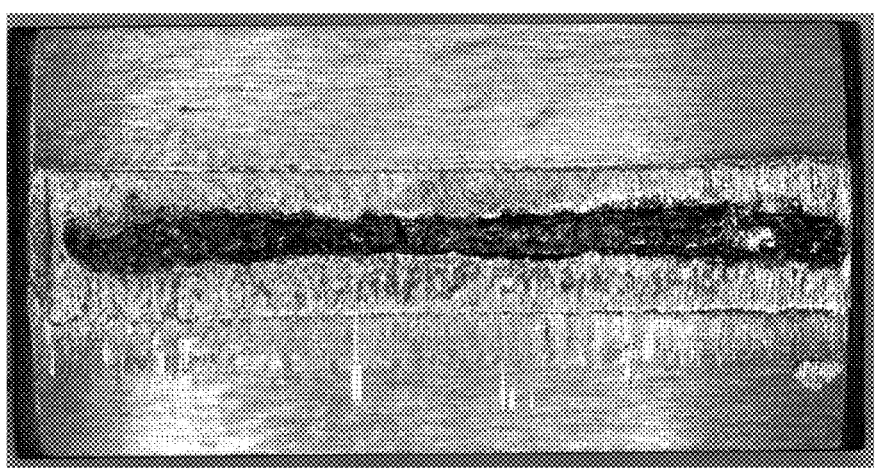
Figure 5B:
Figure 5B:
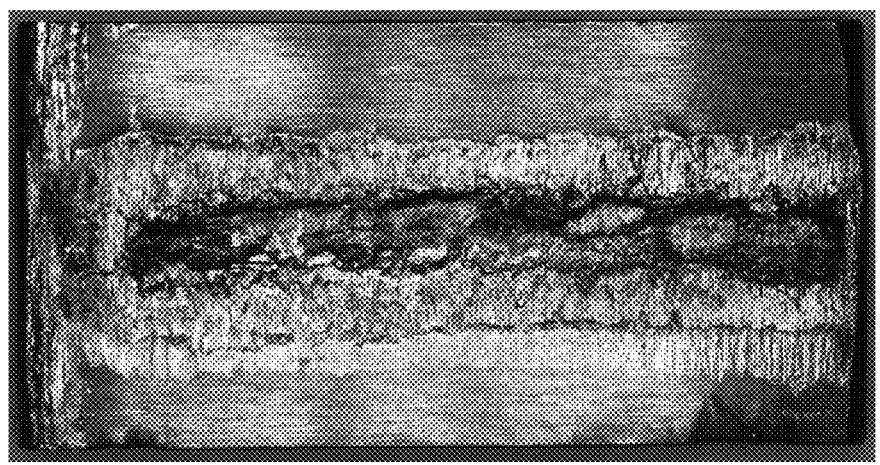
Figure 5D:
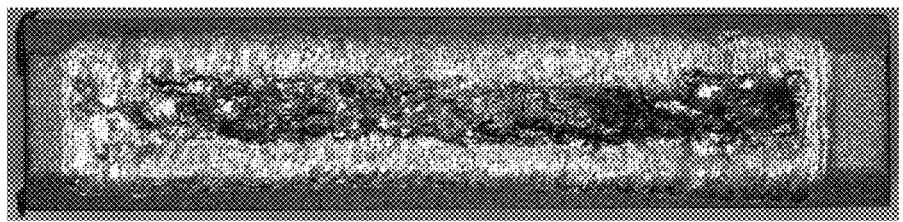
Figure 5D:
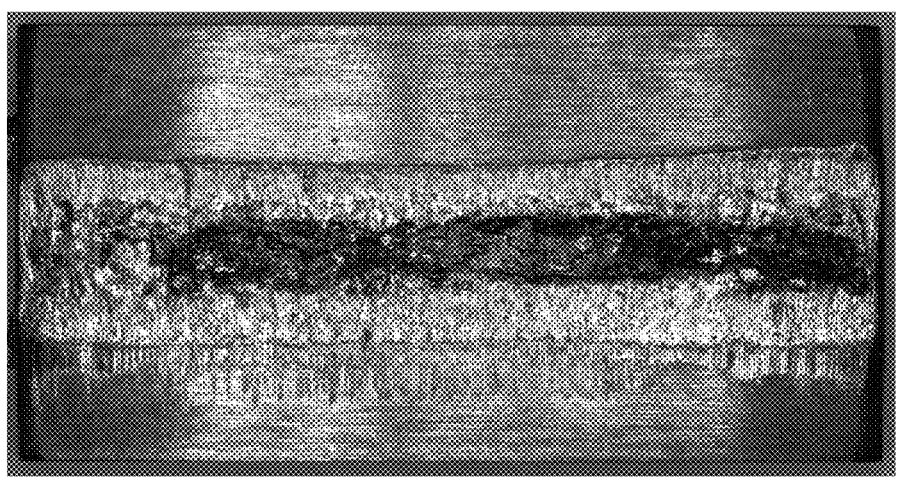
Figure 5C:
Figure 5C:
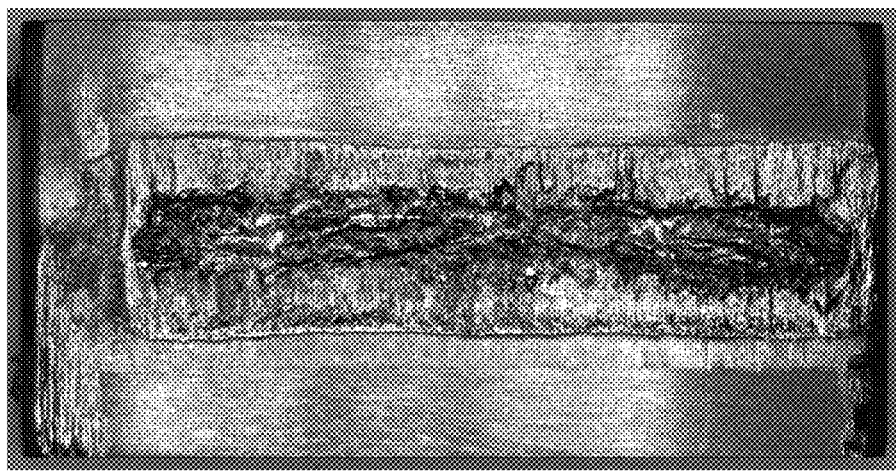
Figure 5E:
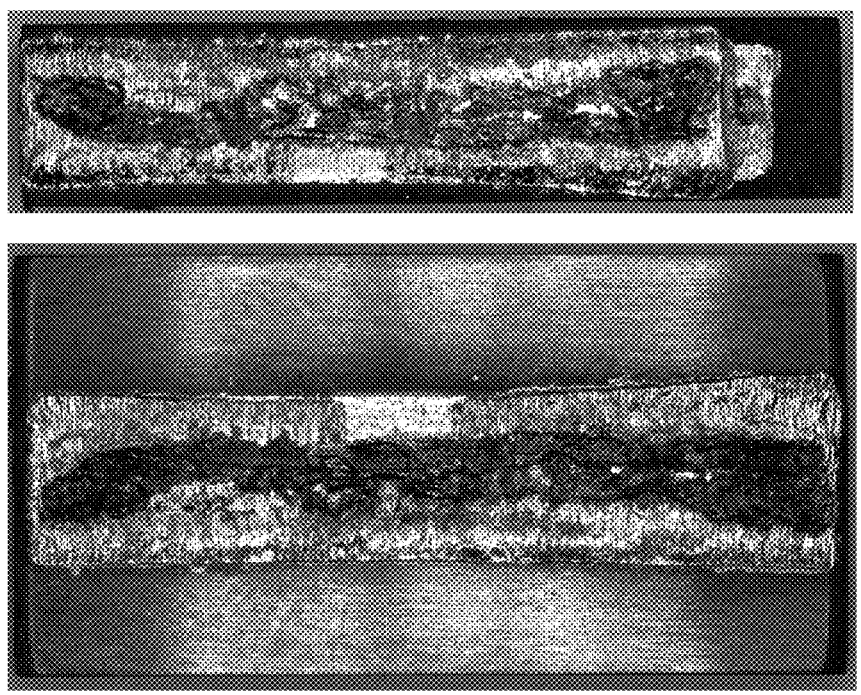

In some examples, metallic protective layer 54 may be oxidized to form an environmentally-resistant oxide layer before depositing wear resistant oxide layer 38. FIG. 4 is a conceptual diagram illustrating a cross-sectional view of an example article 70 that includes a substrate 32 and a coating 62 that includes a diffusion barrier layer 36, a metallic protective coating 54, an environmentally resistant oxide layer 64, and a wear resistant oxide layer 38.

Substrate 32, diffusion barrier layer 36, metallic protective layer 54, and wear resistant oxide layer 38 may be similar to or substantially the same (e.g., the same or nearly the same) as described above with respect to FIGS. 2 and 3. Coating 62 additionally includes an environmentally resistant oxide layer 64 on metallic protective layer 54, and wear resistant oxide layer 38 is on environmentally resistant oxide layer 64.

In some examples, environmentally-resistant oxide layer 64 may be formed by oxidizing metallic protective layer 54. In some examples, metallic protective layer 54 may include aluminum, chromium, or both. Oxidizing metallic protective layer 54 may form environmentally resistant oxide layer 64 including alumina (aluminum oxide; $Al_2O_3$), chromia (chromium oxide; $Cr_2O_3$), or chromia and alumina, depending on the composition of metallic protective layer 54. In some examples, environmentally resistant oxide layer 64 also may include zirconia, silica, or both. Environmentally resistant oxide layer 64 adheres to metallic protective layer 54. In some examples, oxidation of metallic protective layer 54 may exhaust metallic protective layer 54 such that environmentally resistant oxide layer 64 adheres to diffusion barrier layer 36.

In some examples, coating 52 or 62 may have a total thickness between about 0.00025 inches (about 6.35 μm) and about 0.005 inches (about 127 μm).

In some examples, an article may include a compositional gradient layer between two adjacent layers. For example, article 10 may include a compositional gradient layer between substrate 12 and diffusion barrier layer 16 and/or between diffusion barrier layer 16 and protective layer 18. In some examples, the compositional gradient layer may be substantially continuous, such that the gradient layer has a composition similar to substrate 12 near substrate 12 and has a composition similar to diffusion barrier layer 16 near diffusion barrier layer 16, with a gradual change in composition throughout the gradient layer. In other examples, the compositional gradient layer may include multiple compositionally distinct sub-layers that gradually have different compositions. The composition of the sub-layer nearest to substrate 12 may be more similar to the composition of substrate 12, while the composition of the sub-layer nearest to diffusion barrier layer 16 may be more similar to the composition of diffusion barrier layer 16.

EXAMPLES

Example 1

A mixture including 10 mol. % zirconium butoxide was added to methyltrimethoxysilane (MTMS) solution in isopropyl alcohol (IPA) to form a sol-gel solution. A substrate was coated with Ir by ion beam assisted electron-beam PVD. The Ir-coated substrate was dipped into the sol gel solution. The coated substrate was cured at about 150° C. for about 30 minutes. The dipping and curing was repeated until the desired thickness was achieved. The coated substrate was then sintered at 600° C. to form a wear resistant oxide layer including zirconia.

Example 2

Figure 6:
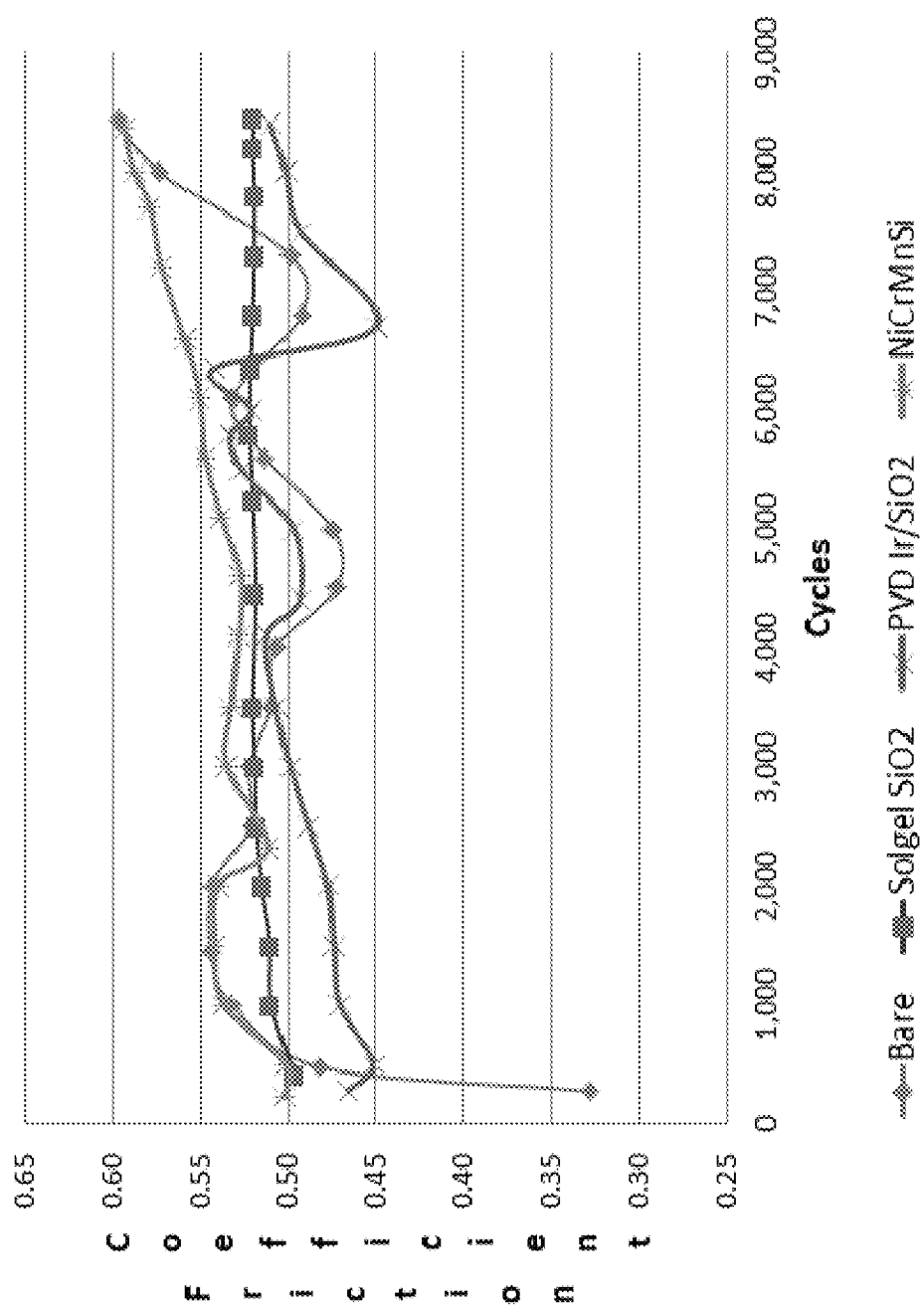
FIG. 6 is a plot illustrating the coefficient of friction for each of a plurality of samples as a function of rubbing cycles.

Wear testing was performed on a plurality of samples. Each sample was tested in contact with an uncoated block formed of a nickel-based superalloy available under the trade designation CMSX-4, from Cannon Muskegon Corp., Muskegon, Mich. The samples tested included an uncoated nickel-based disk alloy, a nickel-based disk alloy coated with a $SiO_2$ coating using a sol-gel process, a nickel-based disk alloy coated with an Ir diffusion barrier layer and a $SiO_2$ layer deposited using PVD, and a nickel-based disk alloy coated with a NiCrMnSi alloy layer. For each sample, the block of CMSX-4 was rubbed against the coated or uncoated nickel-based disk alloy at a temperature of about 675° C. at a stress of about 85 kilopound per square inch (ksi) (about 586 megaPascals (MPa)). The samples were rubbed at a frequency of about 1 Hz and an amplitude of about ±0.0004 inches (about ±10.16 micrometers). FIGS. 5A-5E include a series of photographs illustrating results of the wear testing for each of the samples. FIG. 6 is a plot illustrating the coefficient of friction for each of the samples as a function of rubbing cycles.

As shown in FIG. 6, for the bare nickel disk alloy, the coefficient of friction fluctuated over the 8,500 tested cycles and was nearly 0.6 at the end of the testing. Similarly, the coefficient of friction for the nickel disk alloy coated with NiCrMnSi generally increased as testing proceeded, and ended at about 0.6. On the other hand, for both the sol-gel $SiO_2$ coated nickel disk alloy and the nickel disk alloy coated with an Ir diffusion barrier layer and a $SiO_2$ layer deposited using PVD, the coefficient of friction remained at or below about 0.52 for a majority of the testing, and ended at between about 0.50 and 0.52. The coefficient of friction for the sol-gel $SiO_2$ coated nickel disk alloy was relatively constant throughout the testing.

Various examples have been described. These and other examples are within the scope of the following claims.

The invention claimed is:

1. An article comprising:
a gas turbine engine disk comprising:
   a superalloy substrate that defines at least one fir tree recess; and
   a coating on the superalloy substrate, wherein the coating is on a surface of the at least one fir tree recess and not on a surface of the gas turbine engine disk other than the surface of the at least one fir tree recess, and wherein the coating comprises:
      a diffusion barrier layer on the superalloy substrate, wherein the diffusion barrier layer comprises iridium, and
      a wear resistant oxide layer over the diffusion barrier layer, wherein the wear resistant oxide layer comprises silica.

2. The article of claim 1, wherein the diffusion barrier layer further comprises at least one of silicon, chromium, platinum, palladium, rhenium, ruthenium, or rhodium.

3. The article of claim 1, wherein the diffusion barrier layer as deposited is essentially free of Ti and Co.

4. The article of claim 1, wherein the coating further comprises a metallic protective layer disposed between the diffusion barrier layer and the wear resistant oxide layer.

5. The article of claim 4, wherein the metallic protective layer comprises a metal or an alloy including at least one of aluminum or chromium.

6. The article of claim 5, further comprising an environmentally resistant oxide layer on the metallic protective layer, wherein the environmentally resistant oxide layer comprises an oxide of the at least one of aluminum or chromium.

7. The article of claim 1, wherein the substrate comprises a Ni-based superalloy.

8. The article of claim 1, wherein a thickness of the coating, measured in a direction substantially normal to a surface of the substrate on which the coating is disposed, is between about 6.35 µm and about 635 µm.

9. The article of claim 8, wherein a thickness of the wear resistant oxide layer, measured in a direction substantially normal to a surface of the substrate on which the coating is disposed, is between about 0.5 µm and about 10 µm.

10. A method comprising:
selectively depositing a diffusion barrier layer on surfaces of at least one fir tree recess of a gas turbine engine disk comprising a superalloy substrate, wherein the diffusion barrier layer comprises Ir, and wherein the diffusion barrier layer is not deposited on surfaces of the gas turbine disk other than the surfaces of the at least one fir tree recess; and depositing a wear resistant oxide layer over the diffusion barrier layer, wherein the wear resistant oxide layer comprises silica.

11. The method of claim 10, wherein the diffusion barrier layer further comprises at least one of chromium, silicon, platinum, palladium, rhenium, ruthenium, or rhodium.

12. The method of claim 10, wherein the diffusion barrier layer as deposited is essentially free of Ti and Co.

13. The method of claim 10, wherein depositing the diffusion barrier layer comprises depositing the diffusion barrier layer using at least one of DVD, electroplating, ion-assisted electron-beam deposition, or nano-scale electroplating.

14. The method of claim 10, wherein depositing the wear resistant oxide layer comprises depositing the wear resistant oxide layer using at least one of plasma enhanced chemical vapor deposition (PE-CVD), radio frequency (RF) sputtering, or sol-gel coating.

15. The method of claim 10, further comprising depositing a metallic protective layer comprising a metal or an alloy including at least one of aluminum or chromium on the diffusion barrier layer prior to depositing the wear resistant oxide layer, and wherein depositing the wear resistant oxide layer over the diffusion barrier layer comprises depositing the wear resistant oxide layer on the metallic protective layer.

16. The method of claim 15, further comprising forming an environmentally resistant oxide layer on the metallic protective layer prior to depositing the wear resistant oxide layer, wherein the environmentally resistant oxide layer comprises an oxide of the at least one of aluminum or chromium, and wherein depositing the wear resistant oxide layer over the diffusion barrier layer comprises depositing the wear resistant oxide layer on the environmentally resistant oxide layer.

17. The Article of claim 1, wherein the wear resistant oxide layer further comprises at least one of zirconia, or chromia.

* * * * *